United States Patent
Lee et al.

(10) Patent No.: US 7,851,916 B2
(45) Date of Patent: Dec. 14, 2010

(54) STRAIN SILICON WAFER WITH A CRYSTAL ORIENTATION (100) IN FLIP CHIP BGA PACKAGE

(75) Inventors: Hsin-Hui Lee, Kaohsiung (TW); Mickey Ken, Hsin-Chu (TW); Chien-Hsiun Lee, Hsin Chu (TW); Szu Wei Lu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 485 days.

(21) Appl. No.: 11/082,675

(22) Filed: Mar. 17, 2005

(65) Prior Publication Data
US 2006/0208352 A1 Sep. 21, 2006

(51) Int. Cl.
*H01L 21/20* (2006.01)
(52) U.S. Cl. .............. 257/758; 257/767; 257/768; 257/E21.567; 257/E21.586; 257/E23.012
(58) Field of Classification Search ......... 257/768–795, 257/E21.567–592, 23.012, 33.012–15
See application file for complete search history.

(56) References Cited

U.S. PATENT DOCUMENTS

| | | | |
|---|---|---|---|
| 3,146,137 A * | 8/1964 | Williams | 117/99 |
| 5,970,330 A * | 10/1999 | Buynoski | 438/198 |
| 6,417,573 B1 * | 7/2002 | Pendse | 257/778 |
| 6,469,373 B2 * | 10/2002 | Funakura et al. | 257/679 |
| 7,235,433 B2 * | 6/2007 | Waite et al. | 438/149 |
| 2002/0121663 A1 * | 9/2002 | Azam et al. | 257/330 |

FOREIGN PATENT DOCUMENTS

TW 227353 A 7/1994

OTHER PUBLICATIONS

Taiwan Office Action dated Mar. 6, 2009 from corresponding Taiwan application.

* cited by examiner

*Primary Examiner*—Michael S Lebentritt
(74) *Attorney, Agent, or Firm*—Duane Morris LLP

(57) ABSTRACT

A method and system is disclosed for better packaging semiconductor devices. In one example, a semiconductor device package comprises a package substrate, at least one die with an orientation of <100> placed on the substrate with electrical connections made between the package substrate and the die, and an underfill fillet attaching the die to the substrate with the underfill fillet reaching less than 60% of a thickness of the die on at least one side thereof.

20 Claims, 3 Drawing Sheets

STRAIN SILICON WAFER WITH A CRYSTAL ORIENTATION (100) IN FLIP CHIP BGA PACKAGE

BACKGROUND

The present invention relates generally to semiconductor devices, and more particularly to the manufacturing processes of flip chip ball grid arrays (FCBGAs) using semiconductor substrate having a crystal orientation of (100).

Consumer electronic products such as cell phones, PDAs, digital cameras, etc. are getting smaller, faster, and smarter. Consequently, electronics packaging and assembly capabilities must keep pace. Improvements in materials, equipment performance, and process controls are allowing more companies to move beyond standard surface mount technology (SMT) and into the world of advanced assembly technology. This evolution of large scale integration (LSI) technology is driving package technology growth towards smaller physical size, higher pin count, and higher performance packages. FCBGAs (Flip Chip Ball Grid Arrays) provide an excellent solution to these requirements. An FCBGA is a SMT (surface mount) package which utilizes both flip chip and ball grid array technology. The flip chip technology attaches the semiconductor die to the package substrate internal to the package, while the ball grid array technology attaches the completed package to the printed circuit board. The package substrate is typically comprised of a BT, FR4, FR5, polymer film, PCB, ceramic, glass, or metal lead frame.

The flip chip technology utilizes the flip chip microelectronic assembly, which is the direct electrical connection of face down (hence "flipped" when compared to the conventional wire bond technology layout) electrical components onto substrates, circuit boards, or carriers, by means of conductive solder bumps installed on the flip chip bond pad. The conductive bumps provide the electrical connection to the substrate (in lieu of wire bonds), and also provide a physical standoff between the chip and the substrate. The extensive use of flip chip packaging has been due to its advantages of: decreased size, increased performance, flexibility, reliability, and reduced fabrication cost over other packaging methods. Eliminating packages and bond wires reduce the required board area by up to 95 percent. Flip chip technology offers the highest speed electrical performance of any assembly method. Elimination of the bond wires reduces the effects of inductance and capacitance of the connection by a factor of ten. The result is high speed off-chip interconnections.

In addition, flip chips give the greatest input/output connection flexibility. Conventional wire bond connections are limited to the perimeter of the die. Therefore, as the interconnections increase, the die size may also have to increase to allow for the additional interconnects. However, flip chips can utilize the whole area under the die, accommodating many more connections on a smaller die. The flip chip technology is mechanically the most rugged of all interconnection methods. An adhesive underfill between the die and the package substrate form a solid block of cured epoxy. The flip chip interconnect method is typically the lowest cost interconnection method for high volume automated production. There are three stages in flip chip assemblies: bumping the die, attaching the bumped die to the substrate, and filling the space under/around the die (underfill) to the substrate with an electrically non-conductive material.

The ball grid array (BGA) technology is a conventional SMT connection scheme used to attach the semiconductor device package to a printed circuit board through the use of solder balls on the bottom of the semiconductor device package. The semiconductor device package external connections are arranged as an array of conducting pads on the base of the package. The conducting pads have small solder balls attached to provide the connection to a printed circuit board. There are many advantages to this type of SMT package, such as: lower cost, higher density I/O, less board area utilization, and improved electrical, mechanical, and thermal characteristics.

These processing techniques typically require a thorough consideration of silicon crystal orientation. Certain device properties can depend upon the orientation of the crystal lattice structure. Each crystal orientation has different chemical, mechanical, and electrical properties, such as oxidation, rate, interface density, bonding strength, bonding temperature, capacitances and currents. Therefore, certain processing techniques must consider the orientation of the crystal lattice structure.

The integrated circuit die substrate typically used in conventional FCBGA packages is a silicon crystal wafer that is cut on the (110) plane orientation. There are multiple orientation planes in the silicon crystal that can be used. The planes are defined by the "Miller Indices" methodology, which provides a conventional method to specify planes and direction in a silicon crystal. Common orientations classified by the "Miller indices" are (100), (011), (110), and (111). The orientation of the wafer is classified by which orientation plane the surface of the wafer is parallel to. The surface might not be exactly parallel, but slightly different, and the difference is called the displacement angle or the off angle orientation. The relationship between the crystal's orientation and the radius is marked by either a notch or a flat cut into the wafer, and the orientation adherent to the technology must be considered in modern-day semiconductor processing.

Desirable in the art of FCBGA semiconductor device manufacturing are improved device packaging designs that provide increased electrical, mechanical, and thermal performance at lower cost.

SUMMARY

In view of the foregoing, this invention provides a method to improve FCBGA manufacturing processes through the incorporation of a new silicon wafer crystal orientation as the integrated circuit die substrate.

In one embodiment of this invention, a new silicon wafer crystal orientation (100) will be utilized as the integrated circuit die substrate in lieu of the conventional silicon wafer crystal orientation (110). The new silicon wafer crystal orientation (100) will provide increased bond adhesion between the semiconductor die substrate and the package substrate due to the orientation of the crystal orientation (100). This increased bond adhesion requires less stringent underfill process requirements, increased reliability, and hence lower cost. In one embodiment, a semiconductor device package comprises a package substrate, at least one die with an orientation of <100> placed on the substrate with electrical connections made between the package substrate and the die, and an underfill fillet attaching the die to the substrate with the underfill fillet reaching less than 60% of a thickness of the die on at least one side thereof.

Although the invention is illustrated and described herein as embodied in a method to improve bond adhesion between the semiconductor die and the package substrate of a FCBGA device through the incorporation of a new silicon wafer crystal orientation (100), it is nevertheless not intended to be limited to the details shown, since various modifications and structural changes may be made therein without departing from the spirit of the invention and within the scope and range of equivalents of the claims. The construction and method of operation of the invention, however, together with additional objects and advantages thereof will be best understood from the following description of specific embodiments when read in connection with the accompanying drawings.

DESCRIPTION

The present invention provides a method to improve bond adhesion between the semiconductor die and the package substrate of a FCBGA device using a new silicon wafer crystal orientation (100). It is understood that the same invention can be used for wire bonding packages.

Figure 1A:
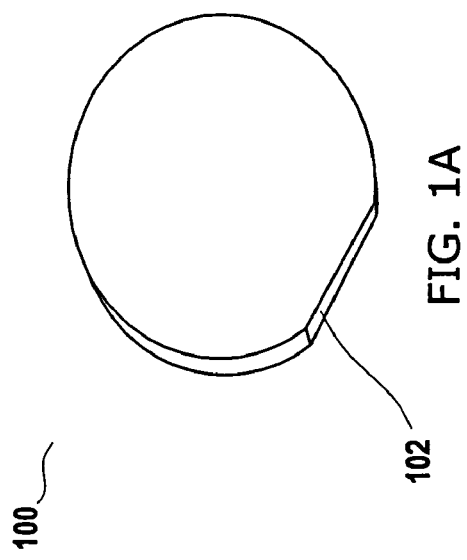
FIG. 1A presents a silicon wafer cut at the crystal orientation (100).

FIG. 1A presents a silicon wafer 100 cut at the silicon wafer crystal orientation (100). A flat end 102 is cut on the wafer circumference on the (011) plane, to be described in FIG. 1B, to orient the wafer during IC fabrication. Silicon crystal orientation is important in semiconductor processing. Certain device properties can depend upon the orientation of the crystal lattice structure. Therefore, certain processing techniques must consider the orientation of the crystal lattice. "Miller indices" provide a conventional method to specify planes and directions in a silicon crystal. The typical silicon orientation structures are (100), (110), and (111), to be described below.

Figure 1B:
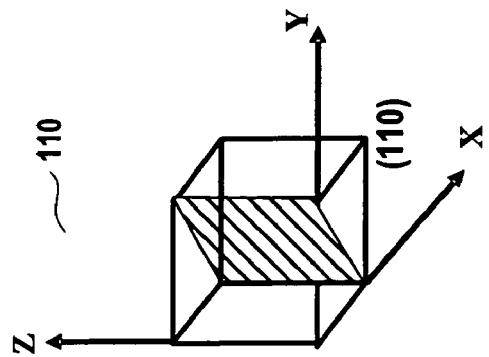
FIG. 1B presents four standard notations for silicon crystal planes.
Figure 1B:
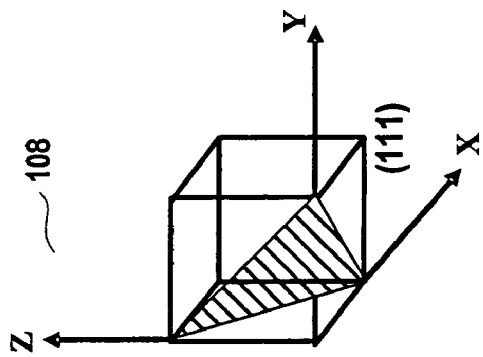
Figure 1B:
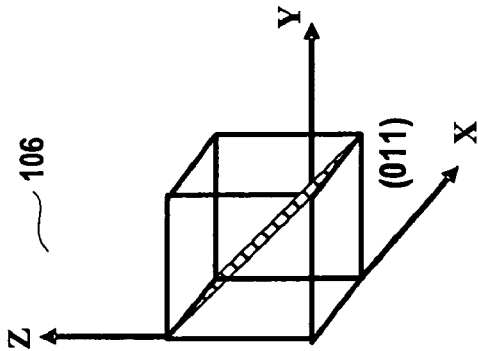
Figure 1B:
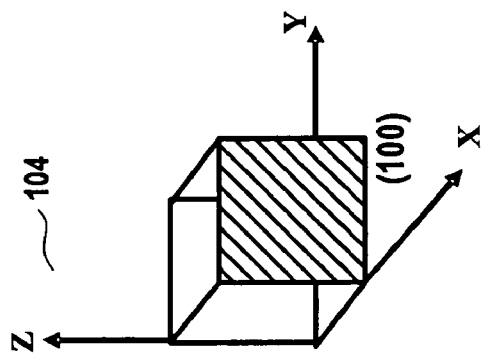

FIG. 1B presents four drawings 104, 106, 108 and 110 showing four silicon crystal planes and the standard notations thereof. "Miller indices" provide a conventional method to specify planes and directions in a silicon crystal. The drawings 104, 106, 108, and 110 show the unit cell of each of the four crystal orientations. Crystals are characterized by a unit cell (small repeatable portion of the structure) which repeats in the x, y, and z directions. It is noteworthy that all four drawings utilize the same x, y, and z placements, and that the shaded area indicates the orientation plane.

Each crystal plane orientation may have different chemical, mechanical and electrical properties. Properties such as: oxidation rate, bonding strength, capacitance, current, etch rate, temperature for bonding, dopant level, or crystal defects may vary from one crystal orientation to another. For example, the etch rate for a wafer with a crystal orientation (100) is one hundred times faster than for a wafer with a crystal orientation (111), while the temperature for bonding of a wafer with a crystal orientation (100) is much lower than those of wafers with crystal orientations (110) or (111). Furthermore, the oxidation rate for a wafer with a crystal orientation (111) is much faster than that of a wafer with a crystal orientation (100).

Figure 2A:
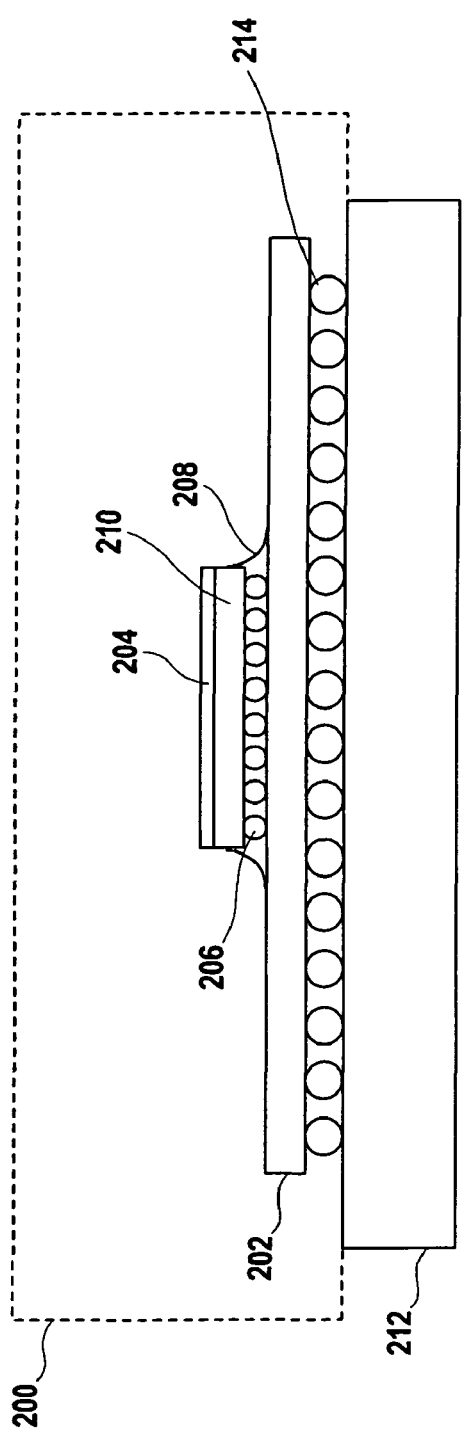
FIG. 2A presents a cross-sectional view of a FCBGA device in accordance with one embodiment of the present invention.

FIG. 2A presents a cross-sectional view of a FCBGA device 200 in accordance with one embodiment of the present invention. The FCBGA device 200 consists of a package substrate 202 with a "flipped chip" integrated circuit die 204 attached to the package substrate 202 by electrical connections (e.g., solder bumps) 206 and tied mechanically to the package substrate 202 by an adhesive underfill 208. The package substrate may include BT, FR4, FR5, polymer film, PCB, ceramic, or glass or any of the combinations. The integrated circuit die 204 is composed of the fabricated die components (area internal to the integrated circuit die 204) on a die substrate 210. Unlike conventional FCBGA devices, which utilize the crystal orientation (110), the crystal orientation (100) is utilized in this embodiment. Conventional FCBGA devices using the crystal orientation (110) are prone to potential mechanical failures which adversely affect device reliability. The FCBGA device 200 is connected to a printed circuit board 212 by an array of interconnections 214, typically solder balls, on each connection pad on the package substrate 202.

Evolution of LSI technology is driving package technology growth towards smaller, higher pin count, higher performance packages. The FCBGA package is a solution to these requirements. Utilization of the area underneath the package for the array of interconnections 214 allows more efficient use of board area. It maximizes the interconnections 214 without increasing the package size. As shown in FIG. 2A, the FCBGA device enables short electrical paths for high frequency applications. Shorter electrical paths provide lower capacitance, lower inductance, and smaller resistance. The FCBGA package facilitates easy and reliable PCB mounting of a package with thousands of solder joints, and allows for simultaneous soldering of all joints in one pass through a reflow furnace. The FCBGA package can also achieve excellent thermal resistance values.

Conventional FCBGA devices utilizing the crystal orientation (110) have potential mechanical problems. For example, two primary failure mechanisms exist in large die, high pin count flip chip packages: underfill to die delamination and die cracking. Underfill delamination most typically occurs during the reflow of a package to a printed circuit board. If a complete adhesion is not maintained, the resulting gap acts as a capillary, possibly causing shorting between the solder bumps. The shorting is further driven by hydrostatic pressure, since the eutectic in the flip chip joint expands when it melts again during the package to printed circuit board soldering process. Die cracking occurs during thermal cycling. Since the zero stress state of the package is approximately equal to the underfill cure temperature, cracking will propagate from initiation sites caused either by assembly processing or by the wafer fabrication process. Utilization of the wafer with the crystal orientation (100) as the die substrate 210 material greatly improves the adhesion of the integrated circuit die 204 to the package substrate 202 and greatly reduces the potential of underfill to die delamination and die cracking. The crystal orientation (100) increases the effective shear strength between the die substrate 210 to the package substrate 202 mechanical connection, compared with the shear strength of the crystal orientation (110). The use of microridges on the wafers with the crystal orientation (100) also increases the shear strength. Studies have found that microridges with a rounded bottom surface fabricated by deep RIE (reactive ion etching) with a sidewall with the crystal orientation (110) in a silicon wafer with the crystal orientation (100) produce the highest shear strength of the crystal orientations.

Figure 2B:
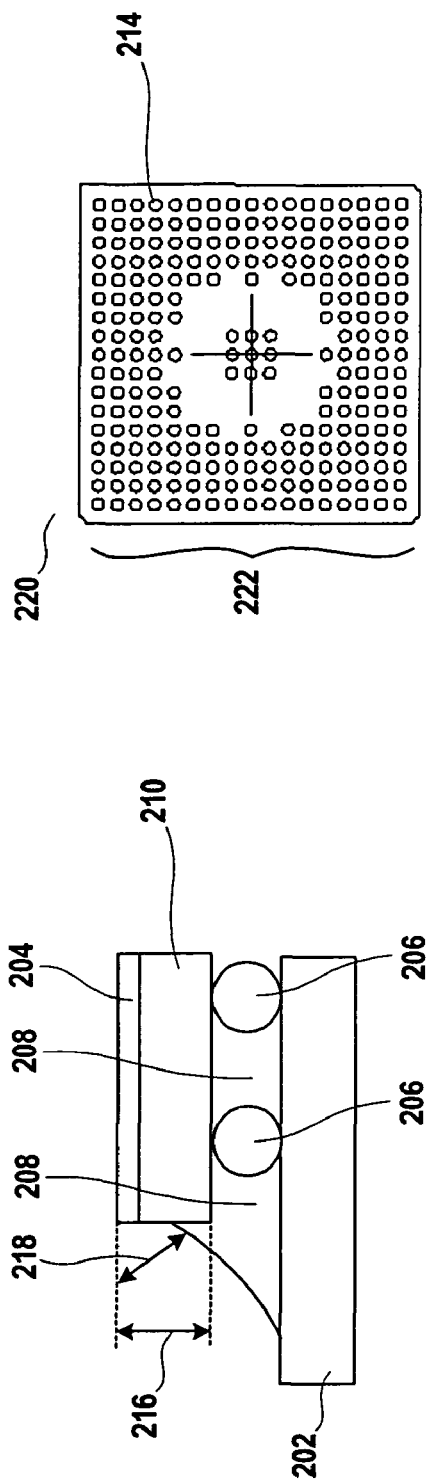
FIG. 2B presents a detailed sectional view of the integrated circuit die to package substrate interconnection in accordance with one embodiment of the present invention.

FIG. 2B presents a detailed sectional view of the integrated circuit die 204 to package substrate 202 physical connection utilizing the underfill 208. The electrical connections 206 provide the electrical solder connection between the integrated circuit die 204 and the package substrate 202. This disclosure utilizes the silicon with the crystal orientation (100) as the semiconductor die substrate 210 material in lieu of the conventional utilization of silicon with the crystal orientation (110). The integrated circuit die 204 is composed of the fabricated die components (area internal to the integrated circuit die 204) and the die substrate 210. The higher mechanical shear strength of silicon allows for relaxation of the underfill requirements to maintain the mechanical bond while simplifying the fabrication process and reducing the fabrication costs. For example, conventional packaging designs using the silicon with crystal orientation (110) require the underfill fillet height to be over 70 percent of the integrated circuit die thickness. The term die thickness includes that for both die 204 and die substrate 210. This underfill fillet height is depicted in FIG. 2B as a length 216. In this example, the total die thickness is less than 50 mil. The increased bonding strength of the silicon wafer substrate with the crystal orientation (100) requires the underfill fillet height to be 0.1 to 45 percent of the die thickness. In some cases, the underfill fillet height is between 30 to 75 percent of the die thickness. The underfill fillet must envelop at least one die corner. The fillet angle 218 (which is between the top surface of the die and the surface of the fillet on the sidewall of the die) is specified as less than 60 degrees for the silicon wafer with the crystal orientation (100). In some other embodiment, the fillet angel 218 is between 30 to 60 degrees, and yet in another embodiment, it is between 0 and 45 degrees. The attaching material or the underfill 208 may be epoxy, epoxy-anhydride, silver glue, or any adhesive polymer.

Figure 2C:
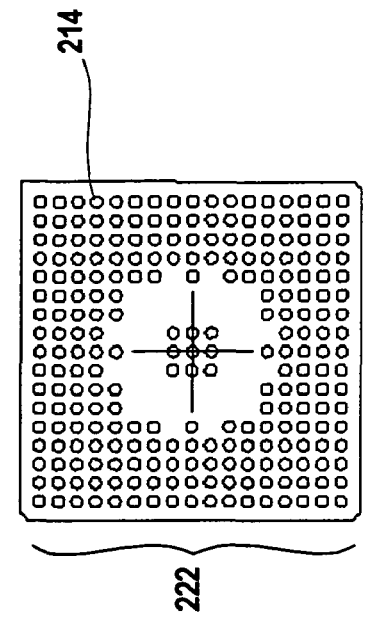
FIG. 2C presents a bottom view of a FCBGA device in accordance with one embodiment of the present invention.

FIG. 2C presents a bottom view 220 of a FCBGA device in accordance with one embodiment of the present invention. The bottom is comprised of an array of connection pads 222 with one attached solder ball 214 on each pad. The solder balls are heated during installation to the printed circuit board 212 to provide the electrical and mechanical connection of the FCBGA device 200 to the printed circuit board 212. It is noteworthy that additional space is still available if additional input/output lines are required without increasing the die size.

Figure 3:
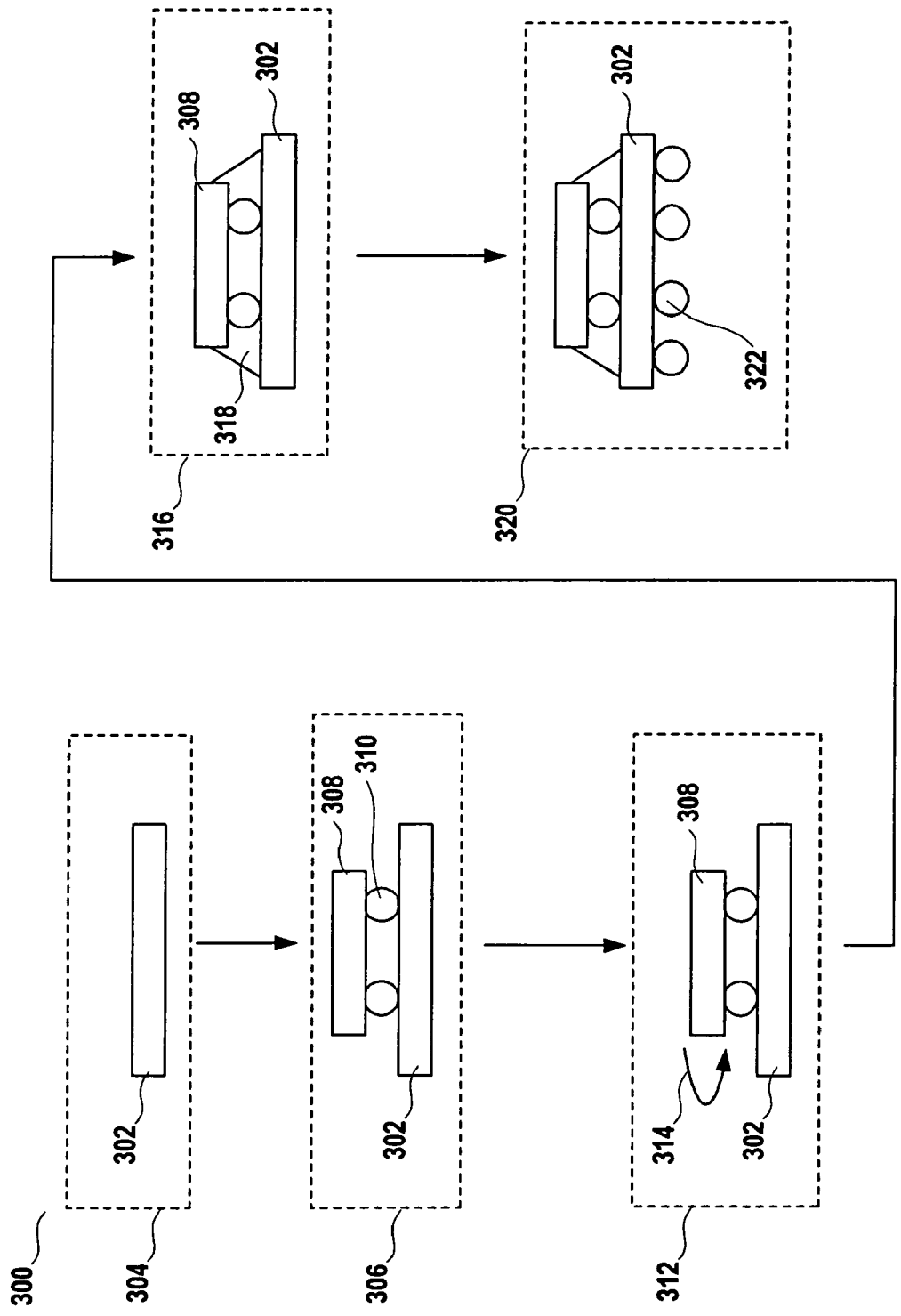
FIG. 3 presents a simplified FCBGA fabrication process flow in accordance with one embodiment of the present invention.

FIG. 3 presents a simplified FCBGA fabrication process flow 300 in accordance with one embodiment of the present invention. The first step is a baking process 304 whereby a package substrate 302 is baked. Extraneous moisture in the substrate may affect the reflow process. It may also affect the cure and subsequent properties of the underfill. Therefore, baking is recommended to remove moisture before assembly or underfilling.

The flow then proceeds to a flip chip bond process 306, which includes the fluxing, die placement and reflow steps to bond an integrated circuit die 308 to the package substrate 302 via various solder bumps 310. The flow then proceeds to a flux cleaning process step 312, which requires a thorough cleaning of the integrated circuit die 308, the package substrate 302, and the area 314 between the integrated circuit die and the substrate to ensure removal of any contaminates due to the flux residue, soldering process, or moisture exposure before the underfilling and bond step. A reliable fluxing process is essential in high volume production. The main function of the flux is to provide a tarnish-free surface and keep the surface in a clean state during the reflow process. The flux also influences the surface tension and thus, the solder flow. The most frequently used methods for flux application are dip fluxing and flux dispensing. The flip chip die placement accuracy is typically tighter than the wirebond die attaching method. The die, with its solder bumps, has to be aligned with the bond pads on the substrate. In general, most flip chip assembly processes require a nitrogen reflow atmosphere.

The flow then proceeds to an underfill process step 316, in which an underfill material 318 is utilized to fill in between the integrated circuit die 308 and the package substrate 302 not only to provide mechanical strength to the package but also to protect the package from moisture. Typical underfill materials are epoxy, epoxy-anhydride or a polymer. The most important function of the underfill, however, is to compensate for the mismatch of thermal expansion between the integrated circuit die 308 and the package substrate 302. The underfill material 318 absorbs the thermal stress by mechanically joining the materials together. The underfill process is essential to increase the fatigue life of solder joints, especially in the case of flip chips on organic substrates. During this step, process parameters are controlled to provide an underfill fillet height to be within a range preferred as mentioned above.

The final step in the flow is a mounting step 320, in which one or more connection modules such as solder balls 322 are connected to the underside of the package substrate 302 for the ultimate connection to a printed circuit board. All of the FCBGA package interconnections (balls) are simultaneously soldered to a printed circuit board in one pass through a reflow furnace.

The above illustrations provide many different embodiments for implementing different features of this invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor device package comprising:
   a package substrate;
   at least one die with an orientation of <100> placed on the substrate with electrical connections made between the package substrate and the die, the orientation being defined by an orientation plane to which an upper or a lower major surface of the die is parallel; and
   underfill fillet attaching the die to the substrate with the underfill fillet reaching only between 0.1 to 45 percent of a thickness of the die on at least one side thereof.

2. The package of claim 1 wherein the underfill fillet includes epoxy.

3. The package of claim 1 wherein the underfill fillet includes epoxy-anhydride.

4. The package of claim 1 wherein the underfill fillet includes silver glue.

5. The package of claim 1 wherein the underfill fillet includes adhesive polymer.

6. The package of claim 1 wherein the underfill fillet envelops at least one corner of the die.

7. The package of claim 1 wherein the die is less than 50 mils in thickness.

8. The package of claim 1 wherein the package substrate includes polymer film, PCB, ceramic or glass material.

9. The package of claim 1 wherein the package is a flip chip package or a wire bonding package.

10. A semiconductor device package comprising:
a package substrate;
at least one die placed on the substrate with electrical connections made between the package substrate and the die; and
underfill fillet attaching the die to the substrate with the underfill fillet reaching only between 0.1 to 45 percent of a thickness of the die on at least one side thereof,
wherein the die comprises components fabricated on a silicon die substrate, the silicon of said silicon die substrate consisting of silicon with a crystal orientation of <100>, the silicon die substrate being cut from a silicon wafer having a pair of parallel planar major surfaces, wherein the orientation is defined by an orientation plane to which the major surfaces of the silicon wafer are parallel.

11. The package of claim 10, wherein the underfill fillet reaches at least 30 percent of the thickness of the die on the at least one side thereof.

12. The package of claim 1, wherein the underfill fillet reaches at least 30 percent of the thickness of the die on the at least one side thereof.

13. A flip chip ball grid array (FCBGA) device comprising:
a package substrate having top and bottom major surfaces, wherein the package substrate has an array of connection pads disposed on its bottom major surface;
at least one die with an orientation of <100> placed on the top major surface of the substrate with electrical connections made between the package substrate and the die, the orientation being defined by an orientation plane to which an upper or a lower major surface of the die is parallel;
an underfill fillet attaching the die to the substrate with the underfill fillet reaching only between 0.1 to 45 percent of a thickness of the die on at least one side thereof; and
a ball grid array disposed on the array of connection pads.

14. The device of claim 13, further comprising a printed circuit board, wherein the package substrate is coupled to a printed circuit board through the ball grid array.

15. The device of claim 13 wherein the underfill fillet envelops at least one corner of the die.

16. The device of claim 13 wherein the die is less than 50 mils in thickness.

17. The device of claim 13, wherein the silicon of said silicon die substrate consists of silicon with a crystal orientation of <100>.

18. The device of claim 13 wherein the underfill fillet includes epoxy-anhydride.

19. The device of claim 13, wherein the array of connection pads includes at least three parallel rows of spaced connection pads or at least three parallel columns of spaced connection pads, and corresponding solder balls coupled to the spaced connection pads.

20. The device of claim 13, wherein the array of connection pads includes at least three parallel rows of spaced connection pads and at least three parallel columns of spaced connection pads, and corresponding solder balls coupled to the spaced connection pads.

* * * * *